(12) United States Patent
Hussain et al.

(10) Patent No.: US 10,777,512 B2
(45) Date of Patent: Sep. 15, 2020

(54) ACTIVATABLE ELECTRONIC COMPONENT DESTRUCTION DEVICE

(71) Applicant: KING ABDULLAH UNIVERSITY OF SCIENCE AND TECHNOLOGY, Thuwal (SA)

(72) Inventors: Muhammad Mustafa Hussain, Austin, TX (US); Abdurrahman Gumus, Istanbul (TR)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/333,357

(22) PCT Filed: Sep. 26, 2017

(86) PCT No.: PCT/IB2017/055864
§ 371 (c)(1),
(2) Date: Mar. 14, 2019

(87) PCT Pub. No.: WO2018/069780
PCT Pub. Date: Apr. 19, 2018

(65) Prior Publication Data
US 2019/0214350 A1    Jul. 11, 2019

Related U.S. Application Data

(60) Provisional application No. 62/406,803, filed on Oct. 11, 2016.

(51) Int. Cl.
*H01L 23/34* (2006.01)
*H01L 23/00* (2006.01)
*H01L 23/525* (2006.01)

(52) U.S. Cl.
CPC .......... *H01L 23/576* (2013.01); *H01L 23/345* (2013.01); *H01L 23/5256* (2013.01); *H01L 23/573* (2013.01)

(58) Field of Classification Search
CPC . H01L 23/576; H01L 23/573; H01L 23/5256; H01L 23/345
See application file for complete search history.

(56) References Cited

U.S. PATENT DOCUMENTS 7,638,866 B1 * 12/2009 Bean ................. H01L 23/57
                                                257/686
7,880,248 B1 *  2/2011 Pham ................ H01L 23/573
                                                257/417
(Continued)

OTHER PUBLICATIONS

International Search Report in corresponding/related International Application No. PCT/IB2017/055864, dated Jan. 8, 2018.
(Continued)

*Primary Examiner* — Sitaramarao S Yechuri
(74) *Attorney, Agent, or Firm* — Patent Portfolio Builders PLLC

(57) ABSTRACT

An activable electronic component destruction device includes a heater and a heat-activated expandable material arranged on top of the heater. Heating of the heater causes the heat-activated expandable material to expand. The device further includes activation electronics coupled to the heater. The activation electronics are configured to control supply of power to the heater, which causes the heater to heat the heat-activated expandable material, which breaks a semiconductor substrate arranged on top of the heat-activated expandable material.

20 Claims, 9 Drawing Sheets

(56) References Cited

U.S. PATENT DOCUMENTS

| | | | |
|---|---|---|---|
| 9,111,924 B2* | 8/2015 | Aliane | H01L 23/49811 |
| 9,209,083 B2 | 12/2015 | Hussain et al. | |
| 9,520,293 B2 | 12/2016 | Hussain et al. | |
| 10,026,579 B2* | 7/2018 | Whiting | H01H 85/0052 |
| 2006/0163707 A1 | 7/2006 | Hooi | |
| 2011/0127314 A1* | 6/2011 | Heinrich | B23K 35/282 |
| | | | 228/123.1 |
| 2013/0194853 A1* | 8/2013 | Tokuyama | H01L 25/072 |
| | | | 363/131 |
| 2014/0323968 A1* | 10/2014 | Rogers | H01L 21/31133 |
| | | | 604/113 |
| 2014/0346685 A1 | 11/2014 | Afzali-Ardakani et al. | |
| 2017/0010232 A1* | 1/2017 | Daamen | G01N 21/8851 |
| 2017/0092598 A1* | 3/2017 | Ridley | H01L 23/573 |

OTHER PUBLICATIONS

Written Opinion of the International Searching Authority in corresponding/related International Application No. PCT/IB2017/055864, dated Jan. 8, 2018.

* cited by examiner

ACTIVATABLE ELECTRONIC COMPONENT DESTRUCTION DEVICE

CROSS-REFERENCE TO RELATED APPLICATIONS

This application is a U.S. National Stage Application of International Application No. PCT/IB2017/055864, filed on Sep. 26, 2017, which claims priority and benefit to U.S. Provisional Application No. 62/406,803, filed Oct. 11, 2016, the entire contents of which are incorporated herein by reference.

BACKGROUND

Technical Field

Embodiments of the subject matter disclosed herein generally relate to a system, apparatus, and method for destroying electronic components, as well as methods for producing an activatable electronic component destruction device.

Discussion of the Background

Data security is becoming increasingly important to both businesses and individuals. Businesses that lose customer data can be subject to civil lawsuits and government fines, and when the data is protected by specific statutes, such as health data, the costs to a business in both fines and loss of goodwill can be enormous. Individuals now store a significant amount of personal information on various electronic devices and the loss of the electronic device can allow for identity fraud, blackmail over incriminating photos or documents, and the like.

The most secure way to protect data is also the most inconvenient—storing the data on a device maintained in a secure room without access to external networks. Although data stored in other ways can be protected using encryption, this requires strong passwords. Further, processing power continues to increase at a rate that may allow hackers to break even the most sophisticated encryption algorithms in short periods of time.

Thus, the only way to ensure that data is not obtainable from a lost or stolen electronic device is by destroying the device or a memory component of the device. Destroying or altering the functionality of an electronic component is the focus of the emerging technology field commonly referred to as transient electronics. Transient electronics has conventionally focused on healthcare applications, such as electronic monitoring implants that can be reabsorbed by the body over time, biodegradable sensors, and the like.

Recently, there has been some work in physical transient electronics, which involves physical destruction of electronic components. These solutions involve, for example, submerging electronics in dissolvable solutions, using microfluidics as chemical etchants, etc. These liquid-based solutions are typically too slow, fully destroy the entire electronic device (instead of just selected components), and are difficult to implement due to the need to keep the liquid separated from the electronics until device destruction is required. Another solution involves destroying a chip built on strained glass by a remotely triggered laser, which is inconvenient because it requires a laser and strained glass. Solutions from the healthcare applications suffer from thermal instability and inherent low carrier mobility, which limits the application of these solutions to electronic devices.

Thus, there is a need for methods and apparatus that can quickly destroy an electronic component without destroying surrounding components of an electronic device that is stable enough to use in electronic devices that may be transported in a variety of different environments.

SUMMARY

According to an embodiment, there is an activatable electronic component destruction device. The device includes a heater and a heat-activated expandable material arranged on top of the heater. Heating of the heater causes the heat-activated expandable material to expand. The device further includes activation electronics coupled to the heater. The activation electronics are configured to control supply of power to the heater, which causes the heater to heat the heat-activated expandable material, which breaks a semiconductor substrate arranged on top of the heat-activated expandable material.

According to another embodiment, there is a method for destroying a component of an electronic device. An activation signal is provided to a driver circuit in response to a determination that an activation condition is satisfied. In response to the actuation signal, the driver circuit supplies power to a heater so that heat generated by the heater activates a heat-activated expandable material, which expands and destroys a substrate of the component of the electronic device.

According to yet another embodiment, there is an electronic device, which includes an electronic component, which includes a semiconductor substrate, a heater, and an activatable electronic component destruction device. The activatable electronic component destruction device includes a heat-activated expandable material arranged on top of the heater. Heating of the heater causes the heat-activated expandable material to expand. The activatable electronic component destruction device also includes activation electronics coupled to the heater. The activation electronics are configured to control supply of power to the heater, which causes the heater to heat the heat-activated expandable material, which breaks the semiconductor substrate and destroys the semiconductor device.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of an activatable electronic component destruction device. However, the embodiments to be discussed next are not limited to destroying electronic components but could be applied to destroying other types of devices or components.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
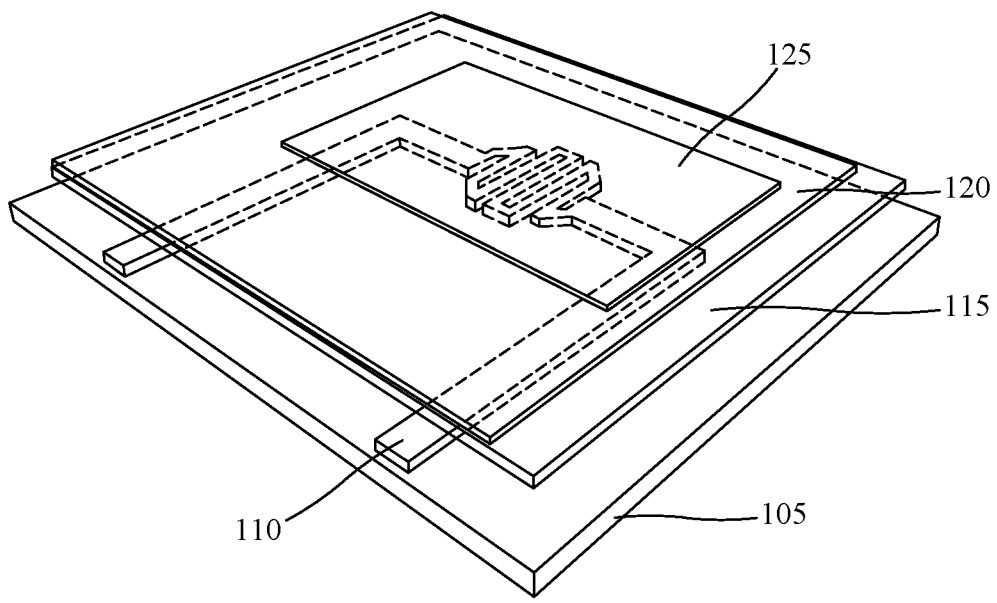
FIG. 1 is a schematic diagram of an activatable electronic component destruction device according to an embodiment.

According to an embodiment there is an activatable electronic component destruction device, an example of which is schematically illustrated in FIG. 1. The device 100 includes a heat-activated expandable material 115 arranged on top of a heater 110. Heating of the heater 110 causes the heat-activated expandable material to expand. Activation electronics (not illustrated in this figure) are coupled to the heater 110 and are configured to control supply of power to the heater 110, which causes the heater 110 to heat the heat-activated expandable material 115, which breaks a semiconductor substrate 125 arranged on top of the heat-activated expandable material 115.

In the illustrated embodiment, the heater 110 is arranged on a flexible substrate 105, such as a flexible polyimide substrate. Further, an adhesive 120, such as double-sided tape, mechanically connects the heat-activated expandable material 115 to the semiconductor substrate 125. The adhesive 120 should be thin enough so that it is able to flex along with the heat-activated expandable material 115 below it to allow the destruction of the semiconductor substrate 125 above it. In one example, the adhesive in the form of a double-sided tape can have a thickness around 30 μm, although other thicknesses can be employed so long as it flexes to allow destruction as described. The semiconductor substrate 125 can form a substrate of an electronic component form with or on, or placed on the semiconductor substrate 125.

The heat-activated expandable material 115 can be an expandable polymer, such as polymeric microspheres having a gas-tight thermoplastic enclosing a small amount of liquid hydrocarbon. Heating of the heat-activated expandable material 115 above a critical temperature by heater 110 softens the polymeric shell and causes the small amount of liquid hydrocarbon inside the shell to undergo a phase change to gas, which results in volumetric expansion of the polymeric microspheres of the heat-activated expandable material 115. Polymeric shells can have different glass phase transition temperatures, and thus a particular type of polymeric shell can be selected for a particular critical temperature for softening the polymeric shell for expansion. In one embodiment, the polymeric shells can have a glass phase transition temperature of approximately 80° C. and the heat-activated expandable material 115 irreversibly expands its volume by approximately 7 times its original volume. The use of a heat-activated expandable material is particularly advantageous because, in some embodiments, it can destroy an electronic component in as little as 10 seconds. Further, the destruction can be localized to a particular electronic component without destroying other components of the electronic device.

In order to destroy an electronic component formed on semiconductor substrate 125, the expansion of the heat-activated expandable material 115 should exert an amount of force greater than the ultimate tensile strength of the semiconductor substrate 125. In the case of a silicon substrate the ultimate tensile strength is 6.89 GPa. Because ultimate tensile strength represents an amount of force per unit area, the thickness of the semiconductor substrate 125 affects how much force is required to be applied by the heat-activated expandable material 115 to destroy the component formed on the semiconductor substrate 125. This can be achieved using a relatively thin semiconductor substrate, such as those produced in the manner described in U.S. Pat. Nos. 9,209,083 and 9,520,293. As noted in the U.S. Pat. No. 9,520,293 patent, semiconductor substrates are generally designed to be thick to avoid damage during manufacture but the thickness does not appreciably affect the overall electrical characteristics of the resulting semiconductor component. Thus, using a relatively thin semiconductor substrate allows for limiting the amount of expansion required by the heat-activated expandable material 115 to destroy the semiconductor substrate 125, which in turn reduces the amount of time required for such destruction and the amount of voltage required to be applied to the heater to cause the destruction. Further, this limited expansion also helps protect other components from being destroyed when the heat-activated expandable material 115 expands.

Figure 2:
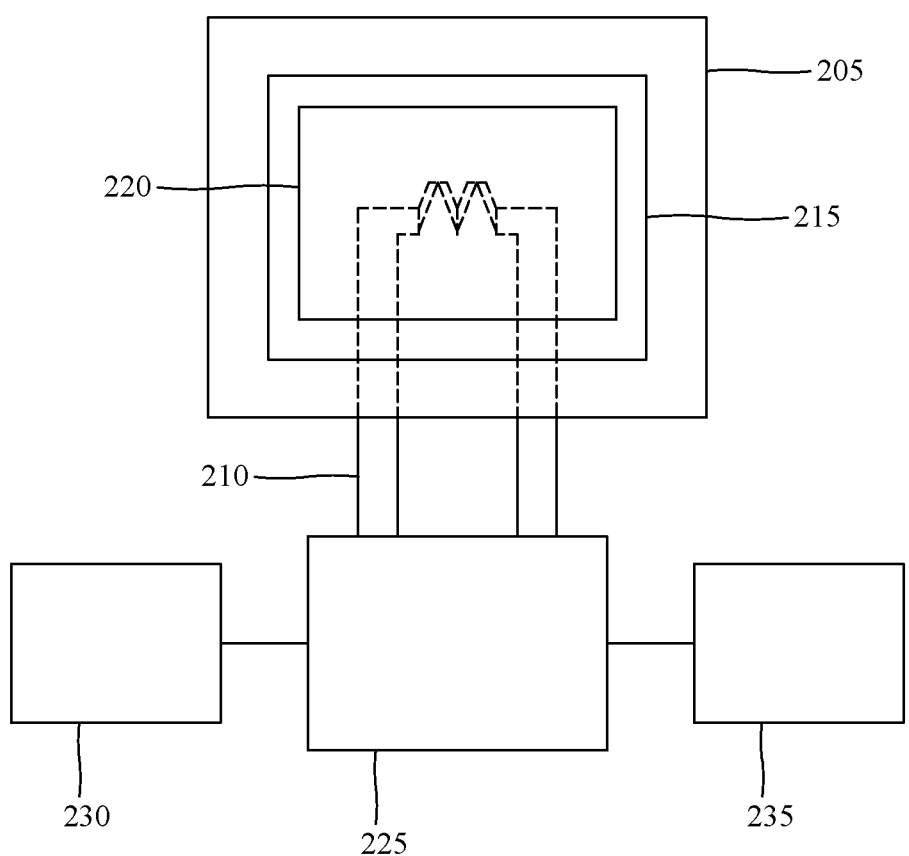
FIG. 2 is another schematic diagram of an activatable electronic component destruction device according to an embodiment.
Figure 3:
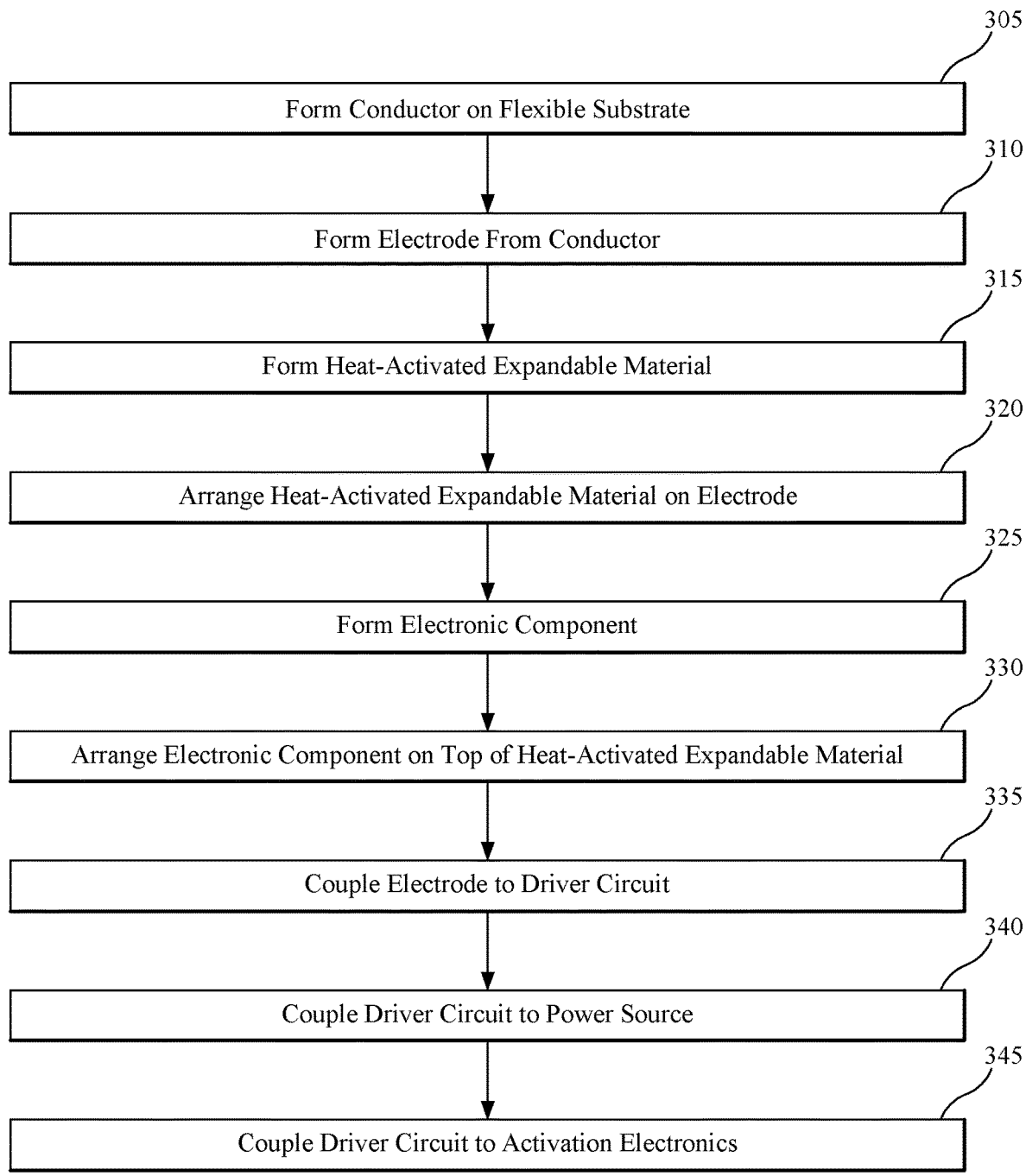
FIG. 3 illustrates a flowchart of a method of producing an activatable electronic component destruction device of FIG. 2 according to an embodiment.

FIG. 2 is another schematic diagram of an activatable electronic component destruction device according to an embodiment and FIG. 3 illustrates a flowchart for producing the activatable electronic component destruction device of FIG. 2. Initially, a conductor is formed on a flexible polyimide substrate 205 (step 305) and then a heater 210 is formed from the conductor (step 310). In an embodiment, the conductor can be formed, for example, by sputtering approximately 200 nm of gold on a 125 μm thick flexible polyimide film and the heater 210 can be formed, for example, by patterning using a 1.06 μm ytterbium-doped fiber laser.

The heat-activated expandable material 215 is then formed (step 315) and arranged on the heater 210. The heat-activated expandable material 215 can be formed using a thermally expandable polymer (e.g., Expancel, 31 DU 40 from AkzoNobel) mixed with polydimethylsiloxane (PDMS) in a 2:1 ratio, which is spin coated on a wafer to obtain an approximately 275 μm sheet of expandable polymer composite. This sheet can then be cured in an oven, for example at 65° C. for 2 hours. After curing, the sheet of expandable polymer composite can be peeled off from the wafer to obtain a thin layer of expandable polymer composite, which can then be arranged on the heater 210 (step 320).

The electronic component 220, including the thin silicon substrate, is then formed (step 325), for example using the trench protect etch release methods disclosed in U.S. Pat. Nos. 9,209,083 and 9,520,293. Specifically, these methods involve a patterned liftoff of, for example, 150 nm thick sputtered gold to obtain the desired circuit design, which is followed by deep reactive ion etching via the Bosch process to create numerous adjacent trenches in the silicon substrate. Aluminum oxide ($Al_2O_3$) can then be deposited through atomic layer deposition (ALD), which can be followed by reactive ion etching (RIE) to remove the deposited aluminum oxide from the top surface of the substrate and the bottom surfaces of the trenches. The exposed silicon surfaces in the trenches can then be isotropically etched using xenon difluoride ($XeF_2$) gas, which results in the release of the thinned flexible silicon layer. The flexible silicon substrate can then be removed using laser etching at the edges and lifting of the substrate using, for example, an instrument with a sharp blade. For ease of explanation, the formation of the electronic component 220 is described as being performed after the arrangement of the heat-activated expandable material on the heater. However, the electronic component 220 can be formed independent of the other steps in the method of FIG. 3 at any point prior to it being combined with the parts of the activatable electronic component destruction device.

After the electronic component 220 is formed (step 325), it is placed on top of the heat-activated expandable material 215 (step 330). The electronic component 220 can be coupled to the heat-activate expandable material 215 using an adhesive, such as double-sided tape. A driver circuit 225 is then coupled to the heater 210 (step 335), and the driver circuit 225 is coupled to a power source 230 (step 340) and activation electronics 235 (step 345), which forms the electronic component destruction device 200. In one embodiment, the driver circuit 225 can be comprised of an NPN bipolar junction transistor (BJT) with a base resistor, which limits the bias current flowing to the gate that will ultimately control the current through the collector. Although not illustrated, a current limiting resistor can be connected in series with the heater 215 to limit the maximum current, and in turn the amount of heat created.

The activation electronics 235 are configured to provide a signal to driver circuit 225 to cause the driver circuit 225 to supply voltage from power source 230 to the heater 215, which causes the heater to heat the heat-activatable expandable material 215, which in turn results in the destruction of the electronic component 220. The order of coupling the driver circuit to the heater, power source, and activation electronics can be different from the order described above and illustrated in FIG. 3.

Figure 4:
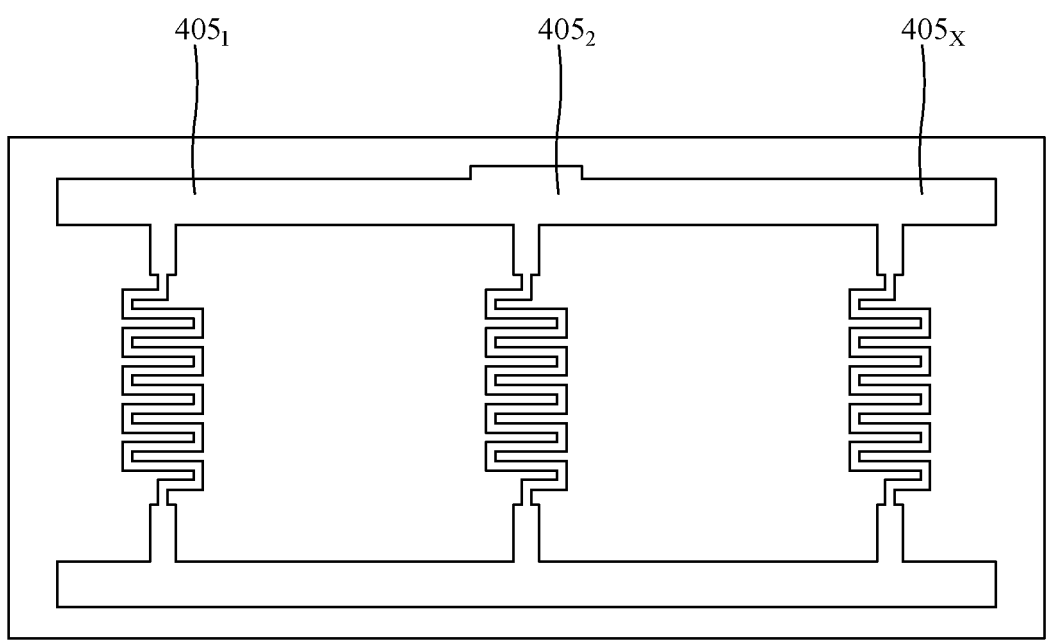
FIG. 4 illustrates an arrangement of heaters for an activatable electronic component destruction device according to an embodiment.

The embodiments above involve a single heater being used to destroy a single electronic component. However, multiple heaters can be employed to destroy a corresponding number of electronic components. In one embodiment, which is illustrated in FIG. 4, this could involve connecting a driver circuit to multiple parallel connected heaters $405_1$-$405_X$. In such an arrangement, the heater $405_1$-$405_X$ sequentially destroy a corresponding electronic component, starting with the heater closest to the driver circuit and power source. Thus, the resistance seen by the driver circuit in this embodiment would increase as each heater $405_1$-$405_X$ is destroyed. The heaters can also be arranged serially, however this would require more power to activate the heaters.

The particular configuration of the heater is not limited to those illustrated in FIGS. 1, 2, and 4. Instead, other configuration can be employed, such those illustrated in FIGS. 5A-5E. As will be appreciated from the discussion above and as illustrated in more detail in FIG. 5A, the heaters include a highly resistive portion 505A and electrodes 502A and 503A that are connected to a power source (not illustrated in the figure) via the driver circuit (not illustrated in the figure). The highly resistive portion is particularly advantageous because it provides localized heating to activate the heat-activated expandable material without causing unnecessary heating of other components of the device that are not intended to be destroyed. Specifically, experiments have shown that the heat generated by the highly resistive portion quickly dissipates along the electrodes.

Figure 5A:
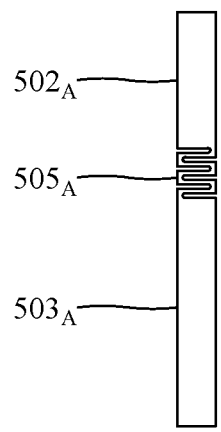
FIGS. 5A-5E illustrate various heaters for an activatable electronic component destruction device according to an embodiment.
Figure 5B:
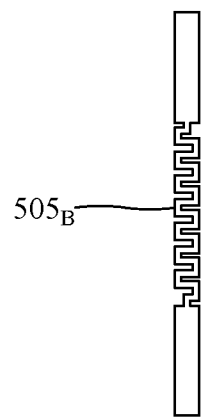
Figure 5C:
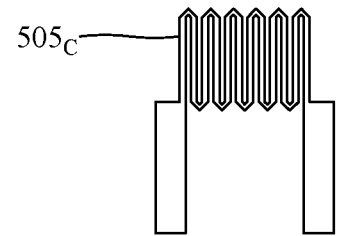
Figure 5D:
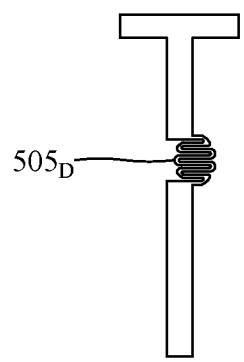
Figure 5E:
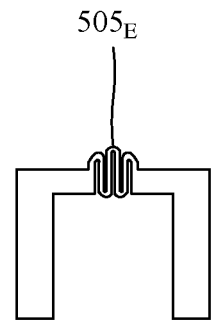

The heaters in FIGS. 5A and 5B include a highly resistive portion 505A and 505B are configured in line with the rest of the heater structure. The difference between the heaters of FIGS. 5A and 5B relates to the overall number of serpentine portions and the spacing between the serpentine portions. The heater arrangement in FIG. 5C includes the highly resistive portion $505_C$ arranged at the ends of the heater leads. The heater arrangement of FIG. 5D includes the highly resistive portion $505_D$ arranged in an offset inline arrangement, whereas the one in FIG. 5E includes an inline arrangement of the highly resistive portion 505E at the end of the heater leads. Further, the serpentine, highly resistive portions 505A and 505B in FIGS. 5A and 5B have a relatively angular configuration, whereas the highly resistive portions $505_C$, $505_D$, and $505_E$ in FIGS. 5C-5E have a more circular configuration. The disclosed heater designs are merely exemplary and other heater designs can be employed.

Figure 6:
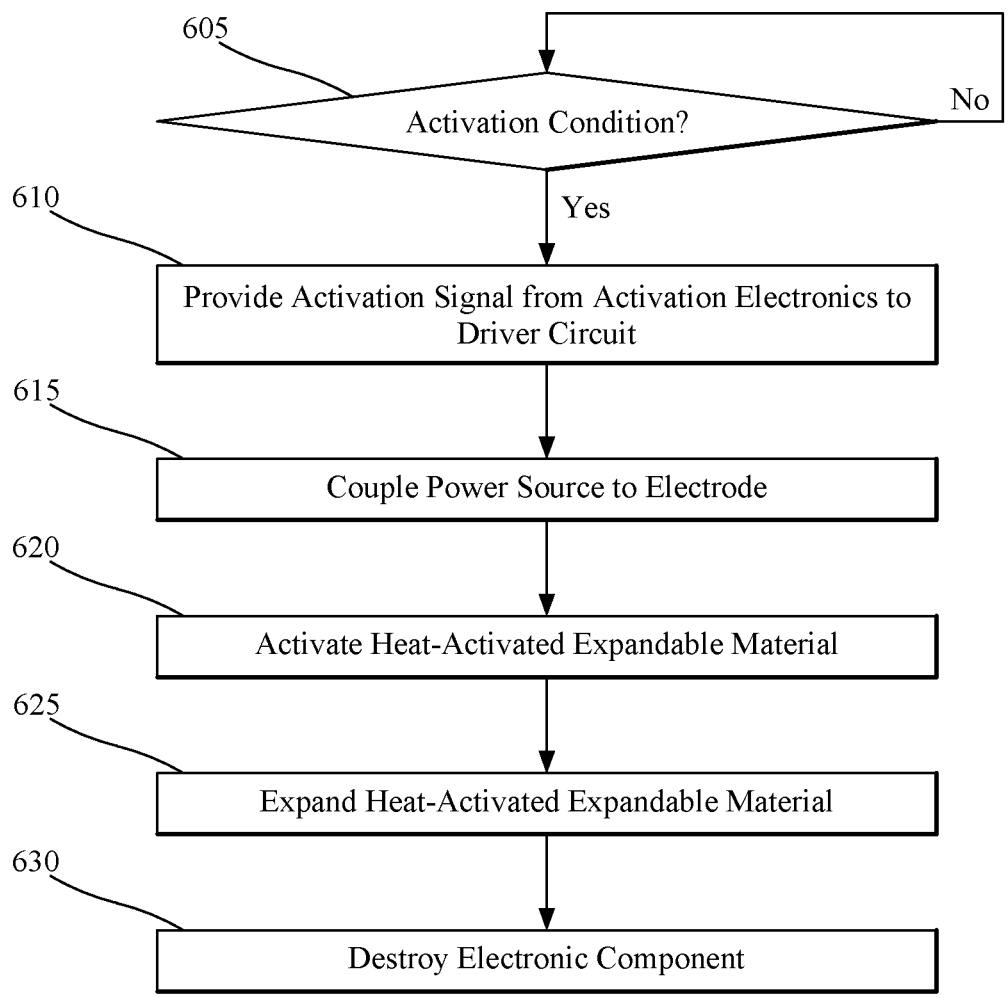
FIG. 6 illustrates a flowchart of a method for destroying an electronic component according to an embodiment.

Operation of an activatable electronic component destruction device will now be described in connection with the flowchart illustrated in FIG. 6. Initially, the activation electronics 235 determine whether an activation condition has been satisfied (step 605). The type of activation condition can vary, including pressure activation, light activation, location-based activation, remotely requested activation, etc., examples of which will be described in more detail below.

When the activation condition is satisfied ("Yes" path out of decision step 605), the activation electronics provide an activation signal to the driver circuit (step 610). The manner of providing the activation signal can vary depending upon implementation. Thus, for a pressure-based or light-based activation condition, the corresponding pressure sensor or light sensor can be configured to only output a signal upon a predetermined pressure or light value being achieved, which signal acts as the activation signal. Alternatively, the pressure sensor or light sensor can output a continuous signal indicating a sensed pressure or amount of light and the driver circuit 225 is arranged to couple the power source 230 to the heater 215 upon satisfying a predetermined pressure or amount of light. Another alternative would involve the sensor outputting a continuous signal unless the predetermined pressure or amount of light is sensed, and then the absence of a signal would be the activation signal.

The driver circuit 225 couples the power source 230 to the heater 215 (step 615), which causes the heater to activate the heat-activated expandable material 215 (step 620), which results in the heat-activated expandable material 215 to expand (step 625) and destroy the electronic component (step 630).

Figure 7:
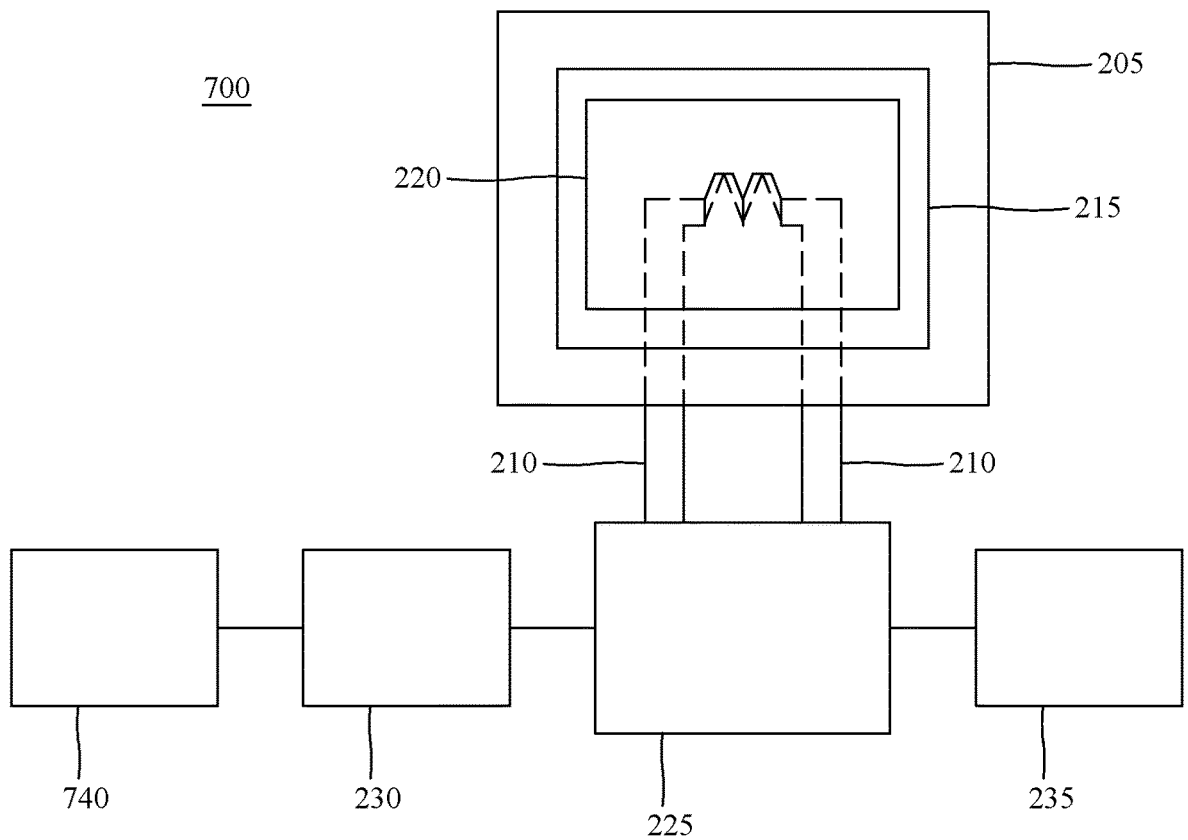
FIG. 7 is a schematic diagram of an electronic device that includes an activatable electronic component destruction device according to an embodiment.
Figure 8:
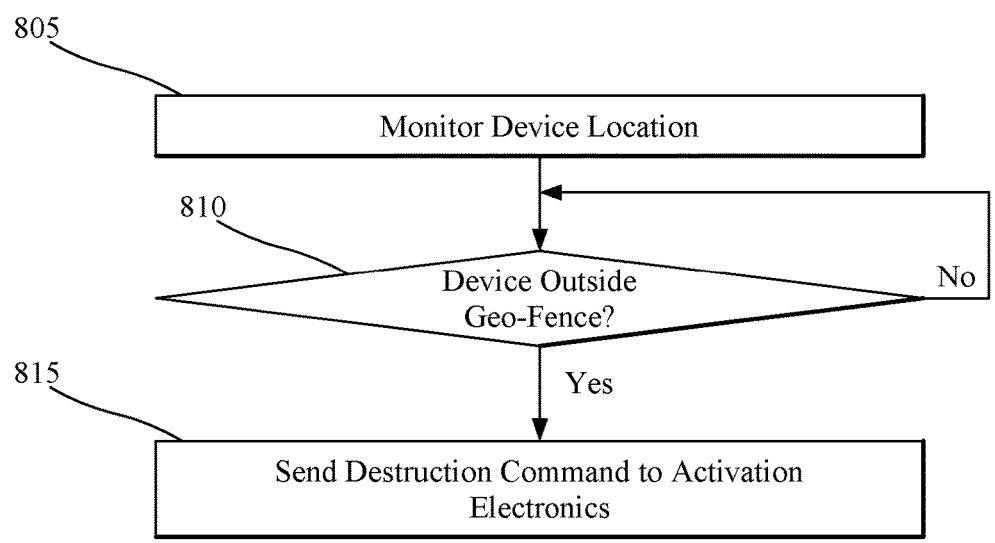
FIG. 8 illustrates a flowchart for destroying the electronic device of FIG. 7.

As discussed above, the activation condition can be based on location, an example of which is illustrated in FIGS. 7 and 8. In this embodiment the electronic component destruction device 700 is similar to the discussed above in connection with FIGS. 1 and 3, with the addition of a location determining device 740. The location determining device 740 can be a Global Positioning Satellite (GPS) receiver or any other device capable of determining a location (e.g., a device reading location based on sensed radio frequency identification (RFID) tags, a device that can determine location based on signals provided by a communication network, such as a cellular network, etc.).

In this embodiment, the activation electronics 230 and/or the location determining device 740 can employ a geographic fence (geo-fence) defining the location(s) within which the electronic device is allowed, thereby defining the electronic device being outside of the geo-fence as an activation condition for the electronic component destruction device 700. Specifically, the location determining device 740 monitors the electronic device's location (step 805) and the activation electronics 230 and/or the location determining device 740 determine whether the determined location is outside a predefined geo-fence (step 810). When the device is outside of the predefined geo-fence ("Yes" path out of decision step 810), then the location determining device 740 sends a destruction command to the activation electronics 230 (step 815), which then sends an activation signal to the driver circuit 225. If the activation electronics 230 performs the determination of whether the location is within the predefined geo-fence (step 810), then step 815 is omitted and the activation electronics 230 sends the activation signal to the driver circuit 225 based on its own determination. As an alternative to activating the destruction device when it is outside of a predefined geo-fence, the destruction device can be activated when it is within a predefined geo-fence.

Figure 9:
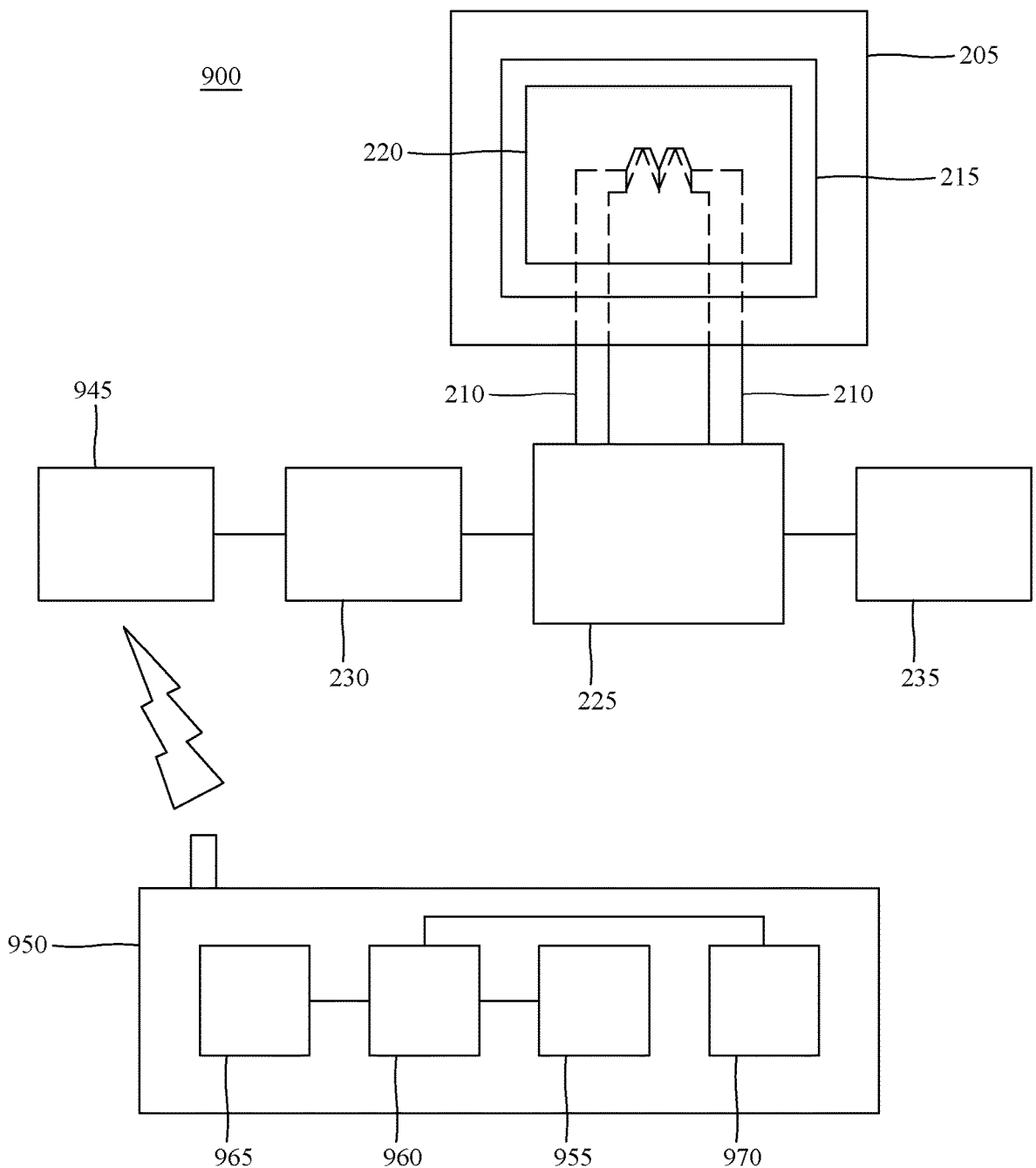
FIG. 9 is a schematic diagram of an electronic device that includes an activatable electronic component destruction device according to an embodiment.
Figure 10:
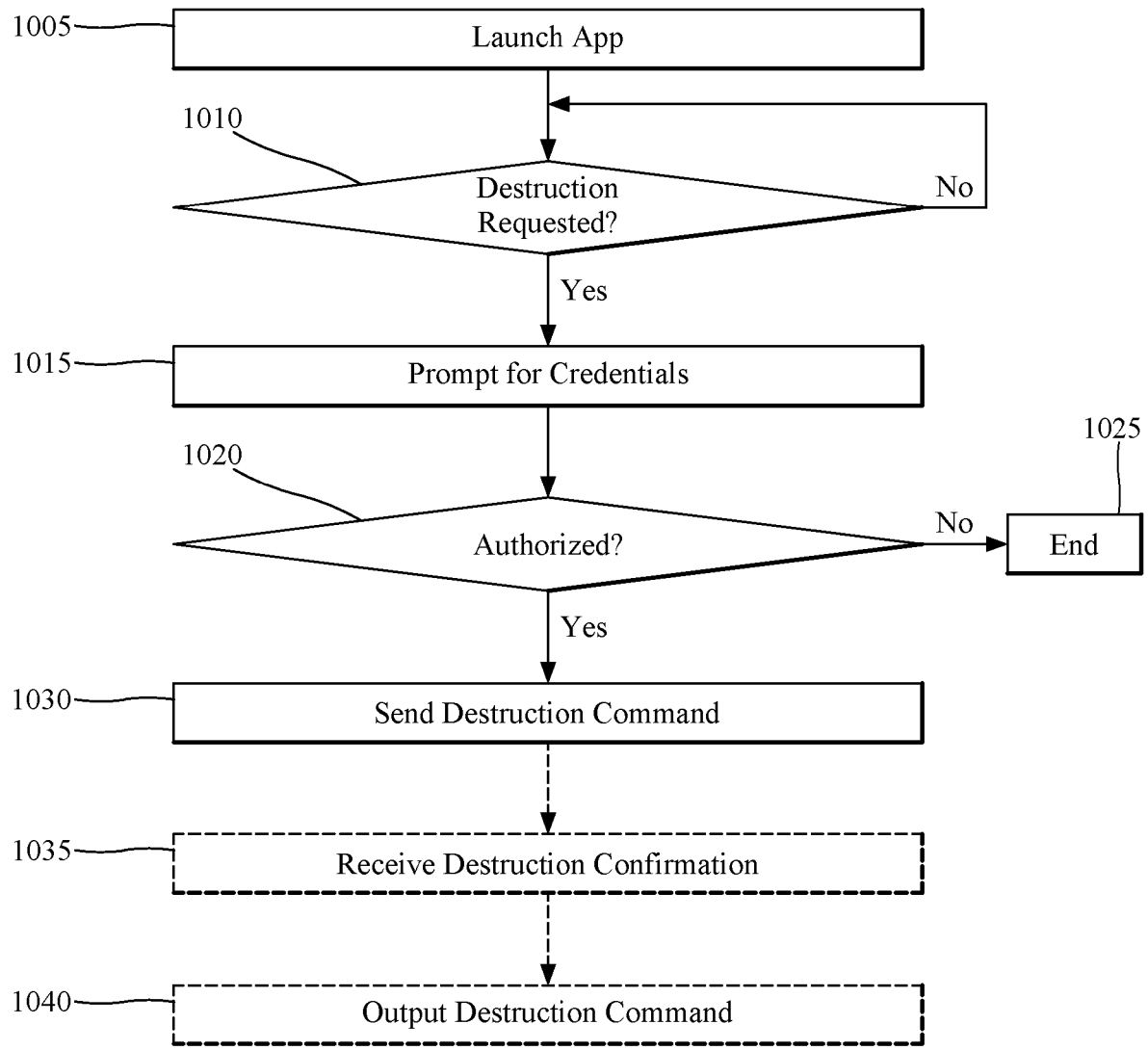
FIG. 10 illustrates a flowchart for destroying the electronic device of FIG. 9.

FIGS. 9 and 10 respectively illustrate a remotely activatable electronic component destruction device 900 and method for remotely activating the electronic component destruction device 900 according to an embodiment. In this embodiment, the remotely activatable electronic component destruction device 900 includes a communication interface 945 coupled to the activation electronics 230. In one embodiment, another communication device 950 executes software, such as an application or app, to perform the method of FIG. 10 to send a remote activation signal. In order to do so, the other communication device 950 includes a memory 955 for storing the software, which is coupled to a processor 960 for executing the software. A communication interface 965 is coupled to processor 960 in order to communicate a destruction command to communication interface 945 of device 900. Also, a user interface 970, such as a touch display, is coupled to the processor 960 in order to provide user inputs and provide outputs for execution of the method of FIG. 10.

Initially, an application is launched on the other communication device 950 (step 1005), which provides a user with an option to remotely destroy a component of the remotely activatable electronic component destruction device 900. The application can provide a variety of options, including the ability for the user to request destruction of a component of device 900. Accordingly, when destruction is requested ("Yes" path out of decision step 1010), the user interface 970 prompts the user for credentials, such as a password (step 1015). This ensures that the component of device 900 is destroyed only by authorized users. If the user is not authorized ("No" path out of decision step 1020), a remote destruction command is not sent and the processing ends (step 1025). The authorization can be performed on device 950 or by communicating with another application or database, such as one coupled to the Internet.

If the user is authorized based on the submitted credentials ("Yes" path out of decision step 1020), the processor 960 sends a destruction command via communication interface 965 to communication interface 945 of device 900 (step 1030).

In one embodiment, the device 900 can confirm that the destruction command has been received. Accordingly, communication interface 965 of device 950 receives a destruction confirmation from communication interface 945 of device 900 (step 1035) and the user interface 970 of device 950 outputs an indication that the destruction has been confirmed (step 1040). In some embodiments, the destruction confirmation is sent after the electronic component of device 900 has been destroyed, while in other embodiments the destruction confirmation is sent upon receipt of the destruction command. The former alternative is advantageous because it confirms the component has actually been destroyed, while the latter alternative allows confirmation of receipt to be provided when the actual destruction confirmation may not be able to be sent due to the component destruction. Of course, these two alternatives can be implemented together.

Although the use of pressure-, light-, location-, and remote activation-based activation have been described separately, any or all of these can be implemented together.

The disclosed embodiments provide an electronic component destruction device, a method of making an electronic component destruction device, and methods of using an electronic component destruction device. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An activatable electronic component destruction device, comprising:
   a heater;
   a heat-activated expandable material arranged on top of the heater, wherein heating of the heater causes the heat-activated expandable material to expand; and
   activation electronics coupled to the heater, wherein the activation electronics are configured to control supply of power to the heater, which causes the heater to heat the heat-activated expandable material, which breaks a semiconductor substrate arranged on top of the heat-activated expandable material,
wherein the heat-activated expandable material includes a polymeric shell that encapsulates liquid hydrocarbon.

2. The activatable electronic component destruction device of claim 1, further comprising:
a driver circuit coupled to and between the heater and the activation electronics; and
a power supply coupled to the driver circuit,
wherein the activation electronics controls the supply of power to the heater by causing the driver circuit to supply the power to the heater from the power supply.

3. The activatable electronic component destruction device of claim 2, further comprising:
another heater coupled to the driver circuit and on which another heat-activated expandable material is arranged,
wherein the activation electronics are coupled to the another heater and the activation electronics are configured to control supply of power to the another heater, which causes the another heater to heat the another heat-activated expandable material, which breaks another semiconductor substrate arranged on top of the another heat-activated expandable material.

4. The activatable electronic component destruction device of claim 3, wherein the heater and the another heater are coupled in parallel with each other.

5. The activatable electronic component destruction device of claim 1, wherein the heat-activated expandable material is an expandable polymer.

6. The activatable electronic component destruction device of claim 5, wherein the expandable polymer comprises a plurality of polymeric microspheres having the thermoplastic shell encapsulating the liquid hydrocarbon.

7. The activatable electronic component destruction device of claim 1, wherein the activation electronics is a pressure sensor.

8. The activatable electronic component destruction device of claim 1, wherein the activation electronics is a light sensor.

9. The activatable electronic component destruction device of claim 1, wherein the activation electronics is a location sensor.

10. The activatable electronic component destruction device of claim 1, wherein the activation electronics is a remotely activatable signal receiver.

11. A method for destroying a component of an electronic device, the method comprising:
providing an activation signal to a driver circuit in response to a determination that an activation condition is satisfied; and
supplying, by the driver circuit in response to the actuation signal, power to a heater so that heat generated by the heater activates a heat-activated expandable material, which expands and destroys a substrate of the component of the electronic device,
wherein the heat-activated expandable material includes a polymeric shell that encapsulates liquid hydrocarbon.

12. The method of claim 11, further comprising:
detecting, by a pressure sensor, a change of pressure, wherein the change of pressure is the activation condition.

13. The method of claim 11, further comprising:
detecting, by a light sensor, a change in illumination, wherein the change in illumination is the activation condition.

14. The method of claim 11, further comprising:
detecting, as the activation condition, that the electronic device is outside of a predefined location.

15. The method of claim 11, further comprising:
receiving, by another electronic device, a request to destroy the electronic device;
authorizing, by the another electronic device, credentials associated with destruction of the electronic device; and
sending, by the another electronic device to the electronic device, a command to destroy the component of the electronic device as the activation condition.

16. An electronic device, comprising:
an electronic component, which includes a semiconductor substrate;
a heater; and
an activatable electronic component destruction device, comprising:
a heat-activated expandable material arranged on top of the heater, wherein heating of the heater causes the heat-activated expandable material to expand; and
activation electronics coupled to the heater, wherein the activation electronics are configured to control supply of power to the heater, which causes the heater to heat the heat-activated expandable material, which breaks the semiconductor substrate and destroys the electronic component,
wherein the heat-activated expandable material includes a polymeric shell that encapsulates liquid hydrocarbon.

17. The electronic device of claim 16, wherein the electronic component is a storage device.

18. The electronic device of claim 16, further comprising:
a positioning device configured to determine a location of the electronic device, wherein the activation electronics are configured to supply power to the heater when the electronic device is outside of a predetermined location.

19. The electronic device of claim 16, further comprising:
a communication interface configured to receive an activation signal external to the electronic device and to supply the activation signal to the activation electronics.

20. The electronic device of claim 16, wherein the activation electronics are a pressure sensor or light sensor.

* * * * *